United States Patent
Ghosh et al.

(10) Patent No.: US 9,858,988 B1
(45) Date of Patent: Jan. 2, 2018

(54) TIMING CIRCUIT FOR MEMORIES

(71) Applicant: QUALCOMM Incorporated, San Diego, CA (US)

(72) Inventors: Sonia Ghosh, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/206,018

(22) Filed: Jul. 8, 2016

(51) Int. Cl.
  G11C 11/00      (2006.01)
  G11C 11/419     (2006.01)
  G11C 11/418     (2006.01)

(52) U.S. Cl.
  CPC .......... G11C 11/419 (2013.01); G11C 11/418 (2013.01)

(58) Field of Classification Search
  CPC .......... G11C 7/22; G11C 7/14; G11C 11/417; G11C 7/04; G11C 7/06; G11C 7/227; G11C 11/4091; G11C 11/41; G11C 11/419; G11C 2207/065; G11C 29/02; G11C 29/023; G11C 7/065; G11C 7/222; G11C 8/18; G11C 2207/061
  USPC .... 365/194, 207, 205, 210.1, 154, 203, 208, 365/156, 189.02, 189.08, 190, 191, 196, 365/201, 210.14, 226, 230.03, 230.06, 365/233.1
  See application file for complete search history.

(56) References Cited

U.S. PATENT DOCUMENTS

| 7,646,658 | B2 * | 1/2010 | Chen ........................ G11C 7/22 365/189.09 |
| 2002/0015333 | A1 | 2/2002 | Furumochi |
| 2002/0191446 | A1 | 12/2002 | Maki |
| 2004/0042275 | A1 * | 3/2004 | Yoshizawa ............... G11C 7/06 365/189.07 |
| 2005/0111267 | A1 | 5/2005 | Onizawa et al. |
| 2008/0089156 | A1 | 4/2008 | Tohata et al. |
| 2014/0010032 | A1 | 1/2014 | Seshadri et al. |
| 2015/0063046 | A1 | 3/2015 | Sinha et al. |
| 2015/0067290 | A1 * | 3/2015 | Chaba ................. G06F 13/1689 711/167 |

OTHER PUBLICATIONS

International Search Report and Written Opinion—PCT/US2017/036365—ISA/EPO—dated Sep. 8, 2017.

* cited by examiner

*Primary Examiner* — Thong Q Le
(74) *Attorney, Agent, or Firm* — Arent Fox, LLP and Qualcomm, I

(57) ABSTRACT

A memory is presented. The memory includes a plurality of memory cells, a wordline coupled to the plurality of memory cells, a sense amplifier coupled to one of the plurality of memory cells, and a timing circuit configured to enable the sense amplifier. The timing circuit includes a delay stage and a dummy wordline. The dummy wordline is configured to emulate at least one portion of the wordline. An apparatus is presented. The apparatus include a first memory having a first wordline coupled to a first number of memory cells. A second memory having a second wordline coupled to a second number of memory cells. Each of the first memory and the second memory includes a timing circuit to enable a memory operation. The timing circuit includes a delay stage corresponding to loading of a third number of memory cells. The third number is different from the first number.

24 Claims, 12 Drawing Sheets

TIMING CIRCUIT FOR MEMORIES

BACKGROUND

Field

The disclosure relates to apparatuses with memories, in particular, to electronic apparatuses and integrated circuits (ICs) with memories incorporating improved tracking circuits.

Background

Memory is a vital component for wireless communication devices. Wireless communication technologies and devices (e.g., cellular phones, tablets, laptops, etc.) have grown in popularity and usage in recent years. These electronic apparatuses have grown in complexity and now commonly incorporate multiple processors (e.g., baseband processor and/or application processor) and other ICs that allow the users to run complex and power intensive software applications (e.g., music players, web browsers, video streaming applications, etc.). With the increased performance demands, an IC for wireless communication applications may incorporate several processors and memories. The memories may have different memory array sizes and memory arrays of different dimensions or configurations.

One design challenge is to reduce the complexity of designing memories of different array sizes. For example, the memory arrays of the memories may be generated by memory compilers. However, the timing circuits operating the memories of different memory array sizes may not be easily generated. One concern is for the timing circuit to balance performance and reliability for the memories of different memory array sizes.

SUMMARY

Aspects of a memory are disclosed. In one implementation, the memory includes a plurality of memory cells, a wordline coupled to the plurality of memory cells, a sense amplifier coupled to one of the plurality of memory cells, and a timing circuit configured to enable the sense amplifier. The timing circuit includes a delay stage and a dummy wordline. The dummy wordline is configured to emulate at least one portion of the wordline.

Aspects of a method for operating a memory are disclosed. In one implementation, the method includes asserting a wordline coupled to a plurality of memory cells and enabling a sense amplifier coupled to one of the plurality of memory cells. The enabling the sense amplifier is based on flowing a signal through a delay stage and a dummy wordline. The dummy wordline is configured to emulate at least one portion of the wordline.

Aspects of an apparatus are disclosed. In one implementation, the apparatus includes a first memory having a first number of memory cells and a first wordline coupled to the first number of memory cells. A second memory includes a second number of memory cells and a second wordline coupled to the second number of memory cells. Each of the first memory and the second memory includes a timing circuit to enable a memory operation. The timing circuit includes a delay stage configured to correspond to loading of a third number of memory cells. The third number of memory cells is different from the first number of memory cells.

Aspects of a method for operating a first memory and a second memory are disclosed. In one implementation, the method includes asserting a first wordline coupled to a first number of memory cells in the first memory, enabling a memory operation of the first memory via a first delay stage, asserting a second wordline coupled to a second number of memory cells in the second memory, and enabling a memory operation of the second memory via a second delay stage. The first delay stage and the second delay stage are configured to correspond to loading of a third number of memory cells. The third number of memory cells is different from the first number of memory cells.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and details of these aspects are capable of modification in various other respects. Accordingly, the drawings and detailed description are to be regarded as illustrative in nature and not as restrictive.

DETAILED DESCRIPTION

Figure 1:
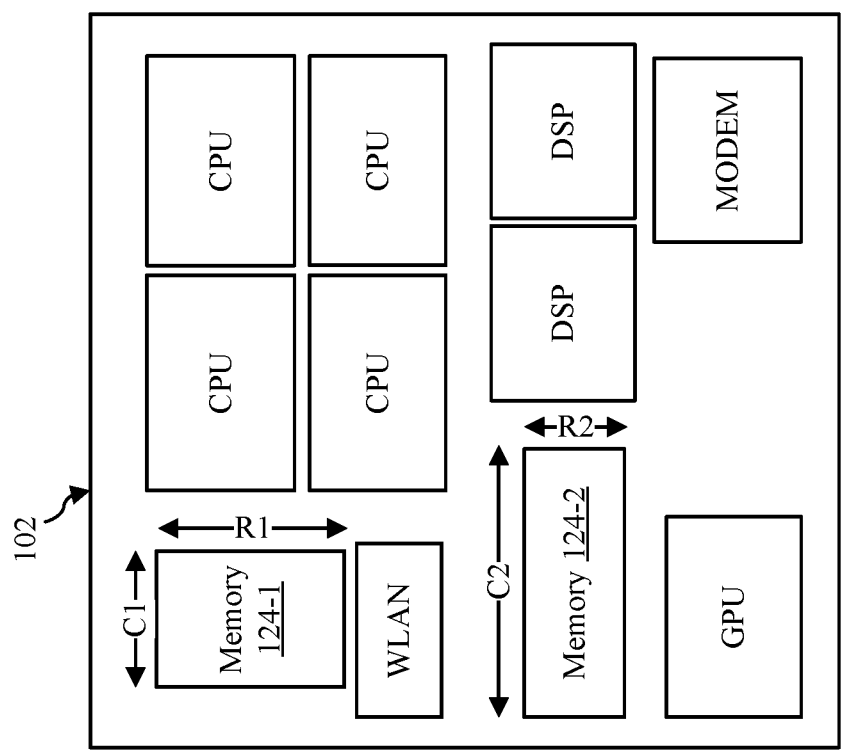
FIG. 1 is a diagram of an exemplary embodiment of an IC incorporating memories of different memory array dimensions.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of the disclosure will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system. Various apparatus and methods presented throughout this disclosure may be implemented in various forms of hardware. By way of example, any of the apparatus or methods, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, or any other suitable integrated circuit. Alternatively, the integrated circuit may be integrated with other chips, discrete circuit elements, and/or other components as part of either an intermediate product, such as a motherboard, or an end product.

The methods disclosed herein comprise one or more operations or actions for achieving the described method. The method operations and/or actions may be interchanged with one another without departing from the scope of the claims. In other words, unless a specific order of operations or actions is specified, the order and/or use of specific operations and/or actions may be modified without departing from the scope of the claims.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of the element. Rather, such designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof. The term "approximate" and/or "approximately" are intended to indicate a degree that is sufficient for the intended purpose, as understood by persons of ordinary skill in the art.

Various aspects of apparatus and methods for sensors for an improved timing circuit are provided in the context static random access memories (SRAM) incorporated within in IC for wireless communication. However, as those skilled in the art will readily appreciate, aspects and applications of the disclosure may not be limited thereto. For example, the disclosure may readily apply to other types of memories and applications. Accordingly, all references to a specific application for the presented apparatus or method are intended only to illustrate exemplary aspects of the apparatus or method with the understanding that such aspects may have a wide differential of applications.

FIG. 1 is a diagram of an exemplary embodiment of an IC incorporating memories of different memory array dimensions. The IC 102 may be on one or more discrete substrates and may include a processor or processors for wireless communication. For example, the IC 102 may incorporate an integrated application and baseband processor for a cell phone. The IC 102 includes various circuit blocks or cores, such as graphic processor unit (GPU), digital signal processors (DSPs), modem for wireless data communication, central processing units (CPUs), and wireless local area network (WLAN) circuit blocks. A circuit block may be, for example, a collection of circuits.

The IC 102 also incorporate various memories, including memories 124-1 and 124-2. The memories in the IC 102 may be used to store program instructions and data. The memories 124-1 and 124-2 may include memory arrays of memory cells arranged as rows and columns of memory cells. The memories 124-1 and 124-2 may be of different memory array dimensions or configurations (e.g., of rows and columns of memory cells). For example, the memory 124-1 may have a memory array of C1 columns and R1 rows, and the memory 124-2 may have a memory array of C2 columns and R2 rows. In one implementation, C2 is greater than C1, and R1 is greater than R2. As a result, the wordlines in the memory 124-1 (each being coupled to C1 columns) may be shorter than the wordlines in the memory 124-2 (each being coupled to C2 columns), and the columns in the memory 124-1 (each being coupled to R1 rows) may be longer than the columns in the memory 124-2 (each being coupled to R2 rows).

As discussed below, the difference in the configurations of the memory arrays may lead to different design requirements for the memories 124-1 and 124-2. Each of the memories 124-1 and 124-2 includes a timing circuit to operate a memory operation (e.g., activating sense amplifiers) in the respective memory. The timing circuits operating the memories 124-1 and 124-2 may be tailored to operate each of the configurations of the memory arrays. However, such design would be time-consuming. Sharing a common scheme for the timing circuits may be advantageous by allowing greater automation for generating the timing circuits.

Figure 2:
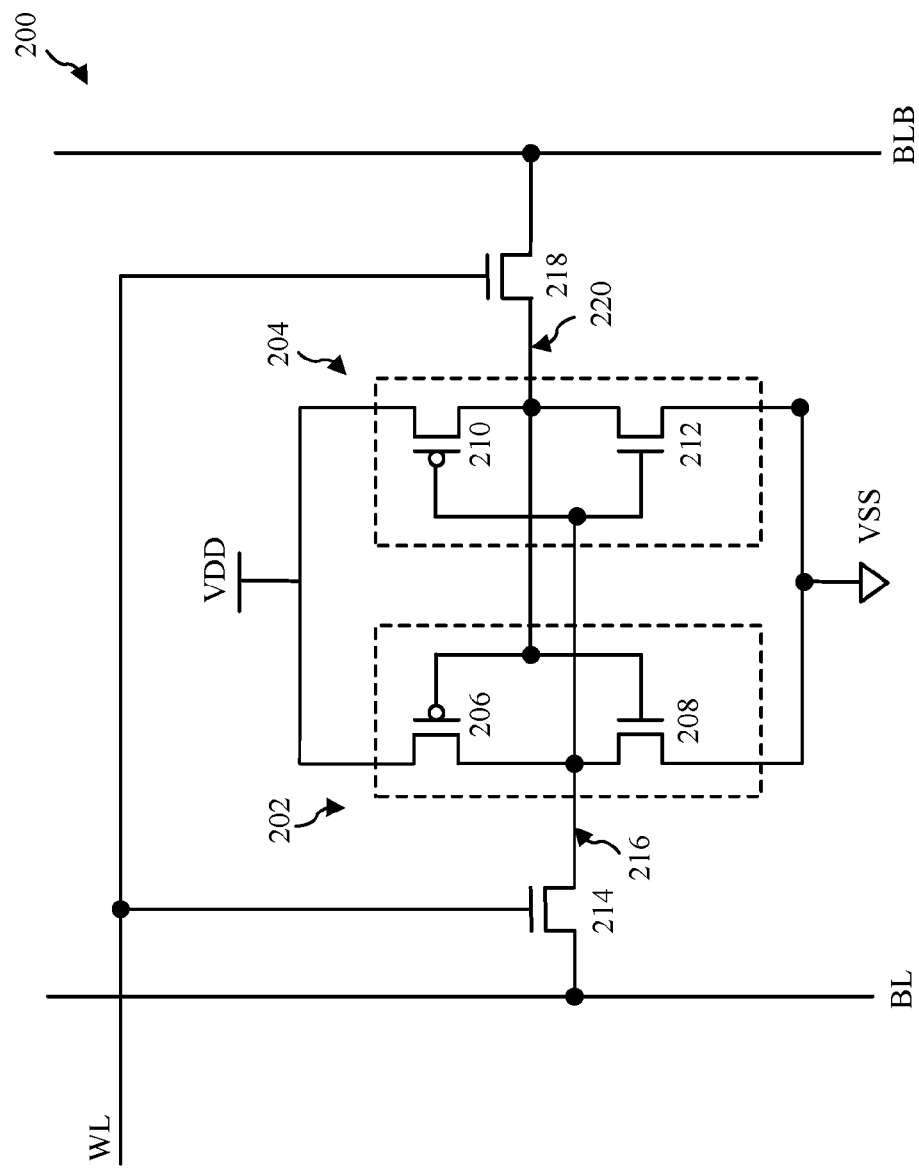
FIG. 2 is a circuit diagram of an exemplary embodiment of a memory cell for an SRAM.

The memories 124-1 and 124-1 may be any suitable memory technology, such as, by way of example, an SRAM. However, as those skilled in the art will readily appreciate, the memory 124 is not necessarily limited to SRAM. An SRAM includes an array of storage elements known as "cells," "memory cells," or "bitcells." Each memory cell may be configured to store one bit of data (e.g., logic 1 or logic 0). FIG. 2 is a circuit diagram of an exemplary embodiment of a memory cell for an SRAM. The memory cell 200 is implemented with a six-transistor (6T) configuration. However, as those skilled in the art will readily appreciate, the cell may be implemented with a four-transistor (4T) configuration or any other suitable transistor configuration.

The memory cell 200 is shown with two inverters 202, 204. The first inverter 202 includes a p-channel transistor 206 and an n-channel transistor 208. The second inverter 204 includes a p-channel transistor 210 and an n-channel transistor 212. In the described embodiment, the inverters 202 and 204 are powered by VDD and have a return VSS (e.g., ground). The first and second inverters 202, 204 are interconnected to form a cross-coupled latch. A first n-channel access transistor 214 couples the output node 216 from the first inverter 202 to a bitline BL, and a second n-channel access transistor 218 couples the output node 220 from the second inverter 204 to a bitline BLB (the value of which is the opposite or inverse of the bitline BL). The gates of the access transistors 214, 218 are coupled to a wordline WL.

A read operation may be initiated by precharging or charging the bitlines BL and BLB to a predetermined level, which is determined so as not to disturb the stored data in the memory cell 200. In some examples, a precharge circuit (not shown for clarity) precharges or pulls up the bitlines BL and BLB to a predetermined level that does not flip the stored data. The predetermined level may be a high level or VDD. In some examples, the predetermined level may be a portion (e.g., half) of VDD. The wordline WL then is asserted, connecting the cross-coupled inverters 202, 204 to the bitlines BL and BLB via the access transistors 214 and 218, respectively. By way of example, the memory cell 200 may store the logic 1 by storing a low level (e.g., ground) at the output node 216 and a high level (e.g., VDD) at the output node 220. The output node states are maintained by the cross-coupled inverters 202, 204. Upon asserting the wordline WL, the inverter 202 discharges the bitline BL through the access transistor 214 and the output node 216. The bitline BLB is maintained at the high level by the inverter 204 through the access transistor 218 and the output node 220. A differential voltage on the bitline pair BL and BLB is thus established by the pull-down of the bitline BL.

The bitlines BL and BLB are fed to a sense amplifier (SA) (not shown), which senses the data (e.g., a differential voltage on the bitline pair BL and BLB) carried thereon and outputs a logic level (e.g., logic 1) as the read data to the peripheral circuit external to the memory. The SA will be discussed in details infra.

A write operation may be initiated by setting the bitlines BL and BLB to the value to be written to the memory cell 200 and asserting the wordline WL. That is, the write data are driven onto the bitlines BL and BLB. The wordline WL may be asserted before or after the value to be written (e.g., write data) is provided to the bitlines BL and BLB. By way of example, a logic 1 may be written to the memory cell 200 by setting the bitline BL to a logic level 0 and the bitline BLB to a logic 1. The logic level 0 at the bitline BL is applied to the input of the second inverter 204 through the access transistor 214, which in turn forces the output node 220 of the second inverter 204 to VDD. The output node 220 of the second inverter 204 is applied to the input of the first inverter 202, which in turn forces the output node 216 of the first inverter 202 to VSS. A logic level 0 may be written to the memory cell 200 by inverting the values of the bitlines BL and BLB. The write driver is designed to be stronger than the pull-up transistors (206 and 210) in the memory cell 200 so that the write data can override the previous state of the cross-coupled inverters 202, 204.

Once the read or write operation is complete, the wordline is de-asserted, thereby causing the access transistors 214 and 218 to disconnect the bitlines BL and BLB from the two inverters 202, 204. The cross-coupling between the two inverters 202, 204 maintains the state of the inverter outputs as long as power is applied to the memory cell 200.

Figure 3:
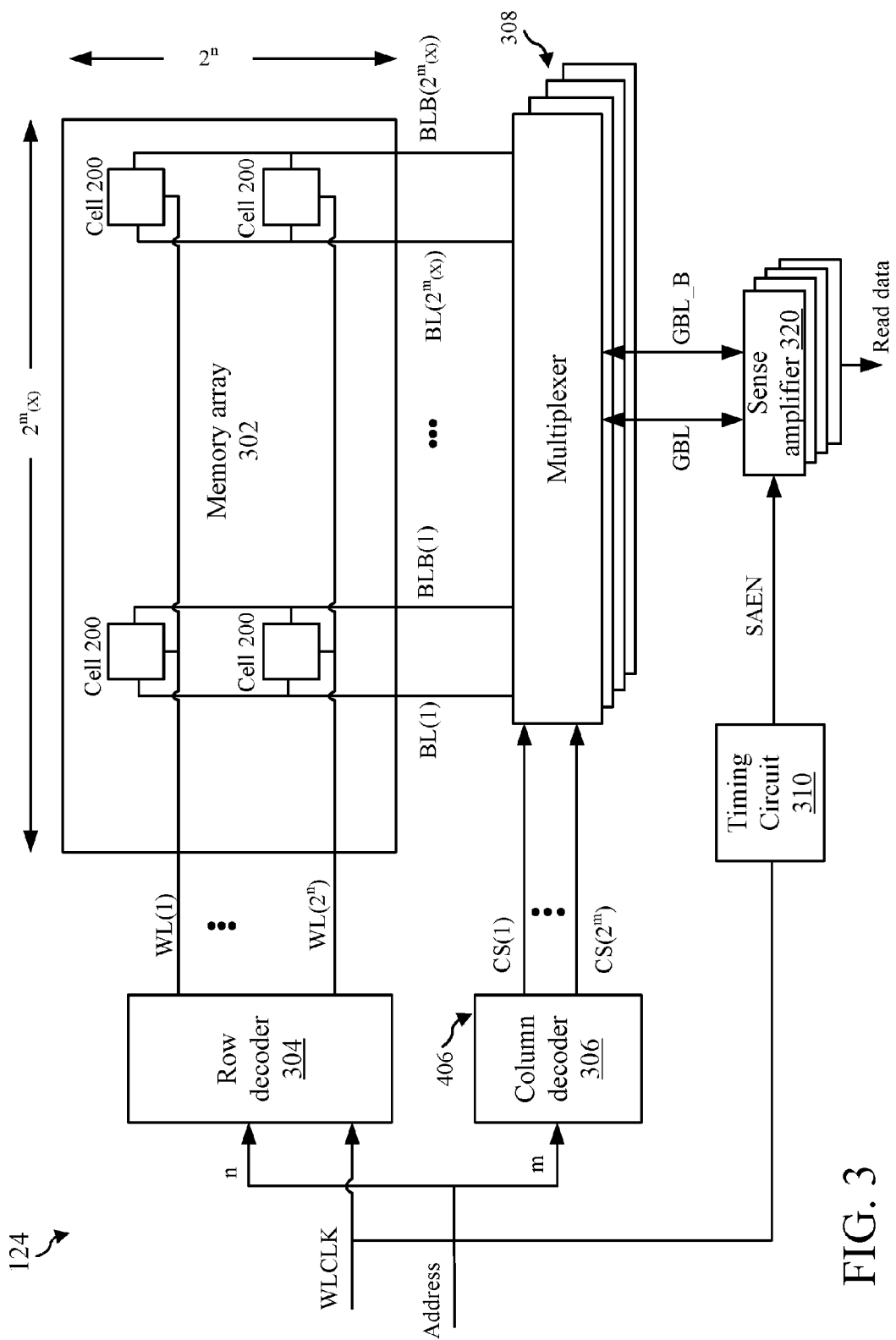
FIG. 3 is a functional block diagram of an exemplary embodiment of a memory of FIG. 2.

FIG. 3 is a functional block diagram of an exemplary embodiment of a memory of FIG. 2. The memory 124 may be incorporated as the memory 124-1 and/or the memory 124-2 of FIG. 1. A read operation is provided by way of example, and the write operation and related circuits are omitted for clarity. The memory 124 includes a memory array 302 with supporting circuitry to decode addresses and perform read and write operations. The memory array 302 includes memory cells 200 arranged to share connections in horizontal rows and vertical columns. Specifically, each horizontal row of memory cells 200 shares a wordline WL and each vertical column of memory cells 200 shares a pair of bitlines BL and BLB. The size of the memory array 302 (i.e., the number of cells) may vary depending on a variety of factors, including the specific application, the speed requirements, the layout and testing requirements, and the overall design constraints imposed on the system. The memory array 302 may contain thousands or millions of memory cells.

In the exemplary embodiment of the memory shown in FIG. 3, the memory array 302 is made up of $(2^n \times 2^m(x))$ memory cells 200 arranged in $2^n$ horizontal rows and $2^m(x)$ vertical columns, where $2^m$ is the number of words per row and x is the number of bits outputted for a read access. Referring back to FIG. 1, in the memory 124-1, the number of rows R1 corresponds to $2^n$, and the number of columns C1 corresponds to $2^m(x)$. Likewise, in the memory 124-2, the number of rows R2 corresponds to $2^n$, and the number of columns C2 corresponds to $2^m(x)$. Referring again to FIG. 3, a peripheral device (not shown) may randomly access any word (i.e., x cells) in the memory array 302 using an address that is (n+m) bits wide. In other words, the memory 124 outputs x-bits of read data for a read operation, and writes x-bits of write data into the memory array 302 for a write operation.

In the memory 124, n-bits of the address are provided to the input of a row decoder 304 and m-bits of the address are provided to the input of a column decoder 306. The row decoder 304 (e.g., a wordline decoder) converts the n-bit address into $2^n$ wordline outputs. A different wordline WL is asserted by the row decoder 304 for each different n-bit row address. As a result, each of the $2^m(x)$ memory cells 200 in the horizontal row with the asserted wordline WL is connected to one pair of the $2^m(x)$ bitlines BL and BLB through its access transistors as described above in connection with FIG. 2. The data stored in the memory cells are provided to the BL_RD and BLB_RD bitline pairs through the selected pairs of bitlines BL and BLB and the x multiplexers 308 with the asserted wordline WL, as described with FIG. 2. The BL_RD and BLB_RD bitline pairs are provided to the SAs 320 for amplification, and the resulting data of the amplification are outputted as read data.

In some examples, the row decoder 304 may be enabled or disabled (e.g., timed) by the signal WLCLK. When the WLCLK signal is de-asserted, the row decoder 304 does not assert any wordline. Thus, the WLCLK signal may control a period and timing of asserting a wordline.

For column decoding, the memory 124 provides m bits of address to the column decoder 306. The column decoder 306 provides $2^m$ outputs column selects (CS(1)-CS($2^m$)) with a different one of the outputs asserted for each different combination of address inputs. The outputs are provided to x multiplexers 308. By way of example, the multiplexers 308 may include passgates. Each multiplexer may be a $2^m$:1 multiplexer and selects one of $2^m$ bitline pairs read from the memory array 302 based on the outputs from the column decoder 306. With x multiplexers 308, x bits are selected and outputted for each read access. In some examples, the multiplexers 308 may be viewed as a $2^m$:1 selector. The selected x bitline pairs are outputted to SAs 320 as bitline pairs GBL and GBL_B.

A timing circuit 310 is configured to time the enabling of the SAs 320. The timing circuit 310 times the enabling to ensure a sufficient voltage differential is develop on the bitline pair BL and BLB (corresponding to the voltage differential on the bitline pair GBL and GBL_B read by the SA 320). If the SA 320 is enabled too soon (e.g., before the voltage differential on the bitline pair BL and BLB reaches a readable threshold), the SA 320 may misread the data and output the wrong value. If the SA 320 is enable too late, then the read access time of the memory 124 is impeded.

Figure 4:
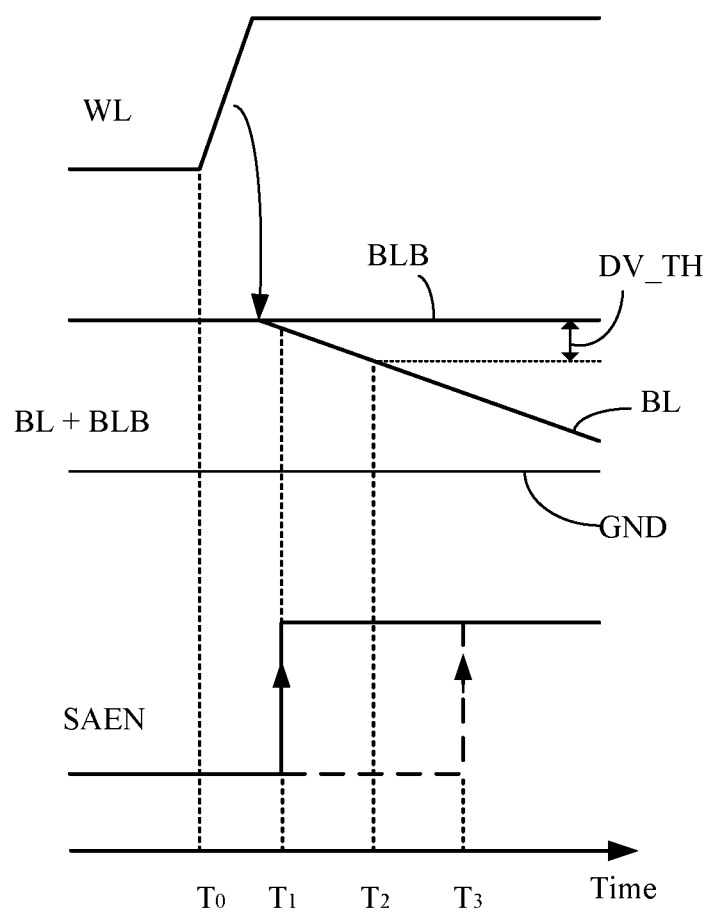
FIG. 4 is a diagram of waveforms of the differential voltage on the bitlines and the sense amplifier being enabled based thereon.

FIG. 4 is a diagram of waveforms of the differential voltage on the bitlines and the sense amplifier being enabled based thereon [for the memory array shown in FIG. 3 employing the memory cell 200 of FIG. 2]. At $T_0$, the wordline WL is asserted (e.g., the row decoder 304 pulls the selected wordline WL to a high level). In response, the memory cell 200 coupled to the selected wordline WL pulls the bitline BL or BLB low. For example, a logic 1 is stored in the memory cell 200 (a low level is stored at the node 216, and a high level is stored at the node 220). The bitline BL is pulled down via the node 216 and the access transistor 214. Consequently, a voltage differential is formed between the bitline pair BL and BLB. A voltage differential threshold DV_TH (at $T_2$) denotes the smallest voltage differential at which the SA 320 may accurately read and amplify the voltage differential on the bitline pair BL and BLB as the read data. In one example, the SAEN signal is asserted (e.g., the timing circuit 310 outputs a high-level SAEN signal) at $T_1$ before $T_2$. As shown in FIG. 4, at $T_1$, the voltage differential at the bitline pair BL and BLB is smaller than the threshold DV_TH and consequently, the SA 320 may output a false read data. In another example, the SAEN signal is asserted at T3 after $T_2$. As such, the read access time is delayed unnecessarily. In an aspect, the timing circuit 310 may time the activation of the SAs 320 (e.g., assert the SAEN signal) to be closer to $T_2$ for both the memories 124-1 and 124-2.

Figure 5:
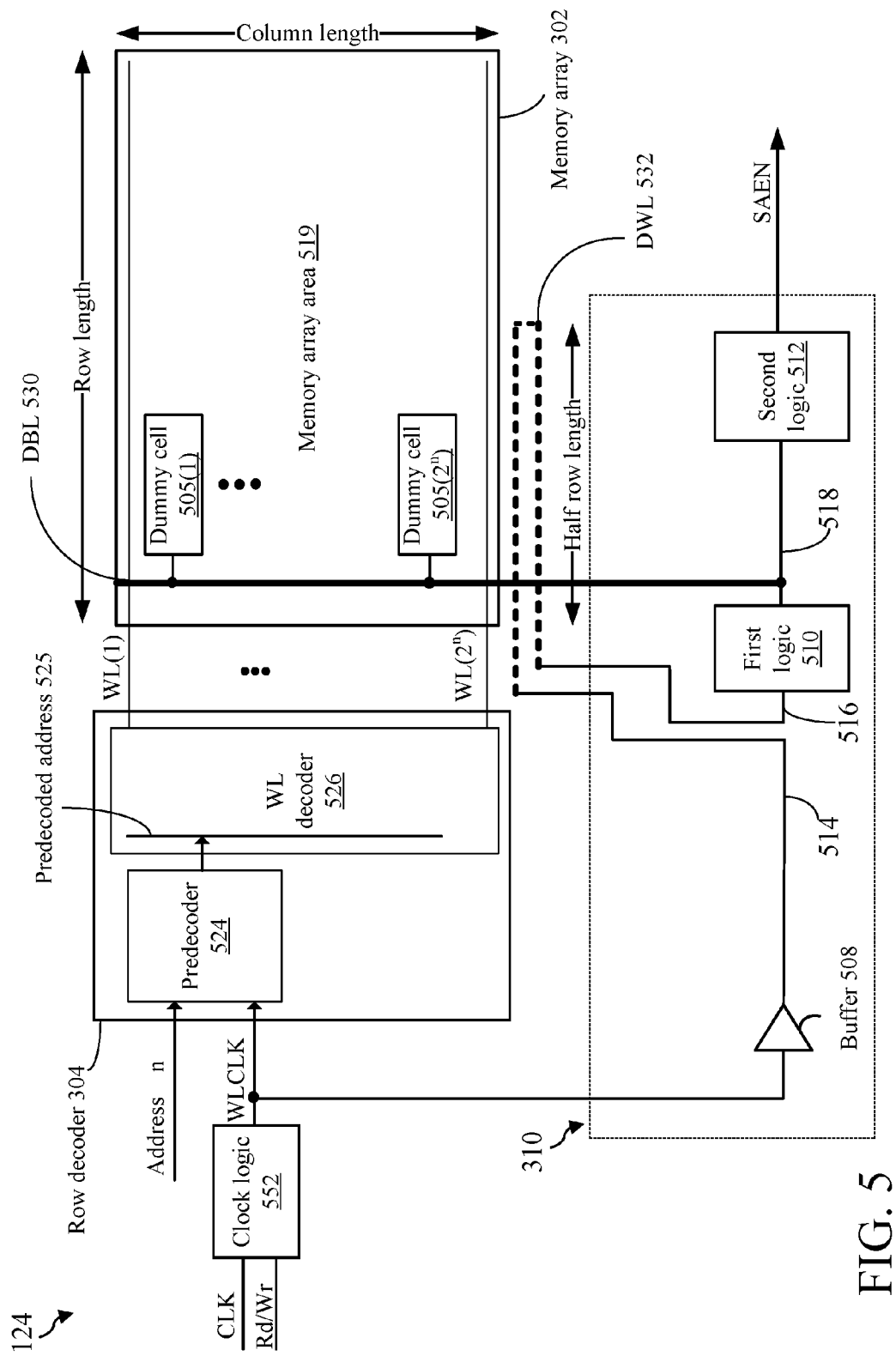
FIG. 5 is a diagram of an exemplary embodiment of a timing circuit operating to enable sense amplifiers.

FIG. 5 is a diagram of an exemplary embodiment of a timing circuit operating to enable sense amplifiers. In the memory 124, the memory array 302 is formed within a physical area, the memory array 519. The memory 124 includes a clock logic 522 configured to receive the system clock CLK and the read/write command Rd/Wr. The read/write command Rd/Wr may enable the assertion of the WLCLK signal. The clock logic 522 may assert the WLCLK to enable the wordline WL based on the CLK timing.

In one implementation, the row decoder 304, as presented in FIG. 3, receives n-bit address (e.g., row address) to assert the selected wordline WL. The row decoder 304 includes a predecoder 524 and a WL decoder 526. The predecoder 524 provides a first stage decoding of the row address and outputs the predecoded address 525. The WL decoder 526 performs the second stage decoding and decodes the predecoded address 525 to assert the selected wordline WL.

Figure 6:
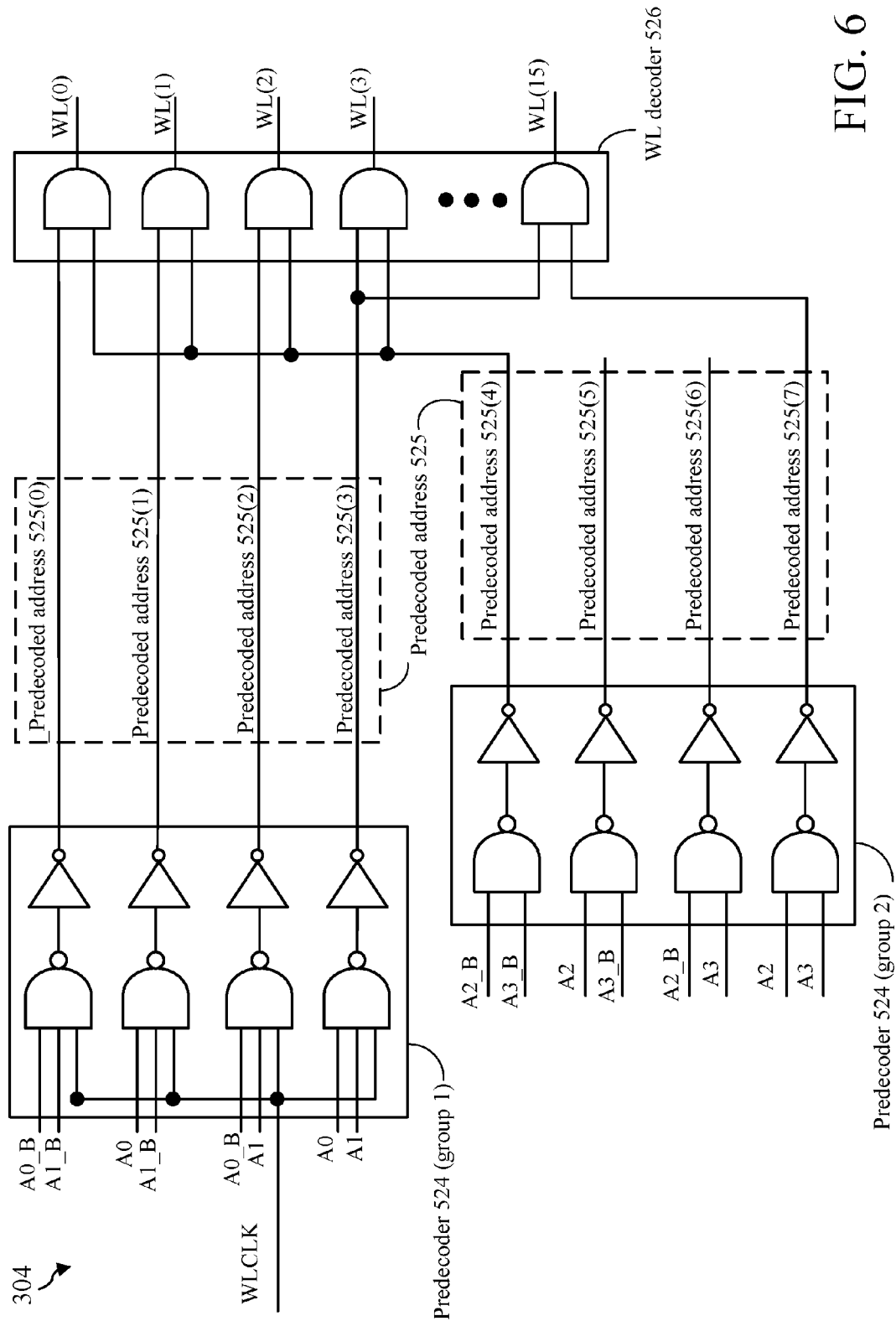
FIG. 6 is a logic diagram of an exemplary embodiment of the row decoder including a predecoder.

FIG. 6 is a logic diagram of an exemplary embodiment of the row decoder including a predecoder. A 4-bit row address is used as an example (e.g., n equals 4). The predecoder 524 may include a first group and a second group of the predecoder 524. The first group of predecoder 524 decodes the row address 0 and 1 (e.g., the lower two bits of the row address) and outputs the first group of predecoded address 525(0-3). When the WLCLK signal is asserted, one of the first group of predecoded address 525(0-3) will be asserted, corresponding to one of the four states of the row address 0 and 1. The second ground of predecoder 524 decodes row address 2 and 3 (e.g., the higher two bits) and outputs the second group of predecoded address 525(4-7). One of second group of predecoded address 525(4-7) will be asserted, corresponding to one of the four states of the row address 2 and 3.

The WL decoder 526 may be configured to generate the 16 wordlines WL and asserted the selected one based on the first group of predecoded address 525(0-3) and the second group of predecoded address 525(4-7). Each of the 16 wordlines WL may be based on one of first group of predecoded address 525(0-3) and one of the second group of predecoded address 525(4-7). In one implementation, the predecoded address 525 may physically extend a distance approximately ¾ of the WL decoder 526. For example, the predecoded address 525(3) is used to generate WL(3) and WL(15), and the two wordlines WL(3) and WL(15) being about ¾ of all the wordlines apart. In other words, the wordlines WL(3) and WL(15) are separated by the space of 12 wordlines (out of a total of 16 wordlines, or ¾ of the total length of the WL decoder 526). Thus, in one physical implementation, the predecoded address 525(3) extends the ¾ distance of the WL decoder 526.

Referring back to FIG. 5, the memory array 302 (e.g., the memory array area 519) is shown to have a dimension of row length by column length. The row length corresponds to a length of the number of columns (e.g., C1 for the memory 124-1 and C2 for the memory 124-2). The column length corresponds to a length of the number of rows (e.g., R1 for the memory 124-1 and R2 for the memory 124-2). In one physical implementation, the WL decoder 526 outputs wordlines WL over the row length of the memory array 302 (e.g., memory array area 519). Thus, the predecoded address 525, at approximately the ¾ length of the WL decoder 526, may extend approximately the ¾ length of the column length.

FIG. 5 further includes the timing circuit 310 configured to generate the SAEN signal to activate the SAs 320. In one implementation, the timing circuit 310 uses a dummy wordline DWL 532 and a dummy bitline DBL 530 to time the asserting of the SAEN signal (to activate the SAs 320). The dummy wordline DWL 532 may emulate the wordline WL, and the dummy bitline DBL 530 may emulate the bitline BL or BLB. The term "emulate" is not limited to the emulator being identical to the object emulated. In some examples, the term "emulate" indicates that the emulator models certain aspects, e.g., physical parameters including resistance or capacitance, of the object emulated.

The dummy wordline DWL 532 may include a conductive layer (e.g., one that is the same as the wordline WL) routed to half of the distance of the wordline WL (e.g., ½ of the row length). The dummy wordline DWL 532 may be folded such that the total length of the dummy wordline DWL 532 is the same or approximately the same as the wordline WL. In such fashion, the dummy wordline DWL 532 emulates the resistance and capacitance of the wordline WL. The dummy bitline DBL 530 may include a conductive layer (e.g., one that is the same as the bitline BL or BLB) routed the same distance of the bitline BL or BLB (e.g., column length). In such fashion, the dummy bitline DBL 530 emulates the resistance and capacitance of the bitline BL or BLB.

In one implementation, the dummy bitline DBL 530 may be routed within the memory array area 519 and therefore, may be implemented using the same process as the memory cells 200 (e.g., same types of metal layers, diffusions, etc.). Moreover, dummy cells 505 may be added to couple to the dummy bitline DBL 530. The dummy cell 505 may emulate (e.g., being identical) to loading of the memory cell 200 to the bitline BL or BLB. FIG. 5 illustrates an example of a same number of the dummy cells 505 being coupled to the dummy bitline DBL 530 as the number of the memory cells 200 being coupled the bitline BL or BLB. In such fashion, the dummy bitline DBL 530 further emulates the bitline BL or BLB. In some examples, the memory compiler may generate the dummy bitline DBL 530 and the dummy cells 505 to automate the process.

In some examples, the dummy wordline DWL 532 may not be routed in the memory array area 519 as a result of a layout limitation of the memory array 302 or a limitation of the memory compiler. Accordingly, the dummy wordline DWL 532 emulating the wordline WL may be less precise.

The timing circuit 310 includes a buffer 508, a first logic block 510, and a second logic block 512. The structures of the first logic block 510 and second logic block 512 are not particularly limiting and therefore, the first logic block 510 and second logic block 512 are shown as blocks. In one implementation, the buffer 508 receives the WLCLK signal and may, in response to an assertion of the WLCLK signal, assert the dummy wordline DWL 532 via the node 514. The signaling on the dummy wordline DWL 532, emulating the wordline WL, is outputted to the first logic block 510 via the node 516. The first logic block 510 may, in response to the signaling from the dummy wordline DWL 532, assert (e.g., pull down) the dummy bitline DBL 530 via the node 518. The signaling on the node 518 thus emulates the pull-down of the bitline BL or BLB by the memory cell 200 in a read operation. The second logic block 512 couples to the node 518 as an input. The second logic block 512 may, in response to the dummy bitline DBL 530 being pulled down to a threshold level (e.g., at the node 518), assert the SAEN signal (e.g., pull high) to enable the SAs 320. The second logic block 512 may, for example, determine the threshold level of the dummy bitline DBL 530 to trigger the assertion of the SAEN signal. The logic blocks 510 and 512 may also add delays for additional timing margins. In the fashion described, the timing circuit 310 times the assertion of the SAEN signal in response to the assertion of the WLCLK signal, via the dummy wordline DWL 532 and the dummy bitline DBL 530.

Applying the timing circuit 310 to memories of various dimensions, such as the memory 124-1 and 124-2, may lead to varying results. To simplify the design process, the added delays in the logic blocks 510 and 512 may be the same for both the memory 124-1 and the memory 124-2. As presented with FIG. 1, in the memory 124-1, the column length may be greater than the row length. Thus, in operating the timing circuit 310 with the memory 124-1, the dummy bitline DBL 530 may dominate the timing of the timing circuit 310. In the timing circuit 310, the dummy bitline DBL 530, being routed in the memory array area 519, may closely emulate the bitline BL or BLB. Thus, the timing circuit 310 may not need to add delays for timing margin to operate in the memory 124-1 in a more reliable way (e.g., the SAs 320 are not activated too early).

In the memory 124-2, the row length may be greater than the column length. Thus, in operating the timing circuit 310 with the memory 124-2, the timing of the dummy bitline DBL 530 may not be as significant in the operation of the timing circuit 310, as compared with the memory 124-1. In other words, the timing of the dummy wordline DWL 532 plays a more significant role in the memory 124-2. In the timing circuit 310, the dummy wordline DWL 532, being routed outside of the memory array area 519, may not closely emulate the wordline WL. Thus, the timing circuit 310 may need to add delays for timing margin to operate the memory 124-2. Referring to FIG. 4, for example, the timing circuit 310 may be set at $T_2$ for optimal read time. When applying the timing circuit 310 to the memory 124-1, due to the added delays, the timing circuit 310 may assert the SAEN signal at $T_3$. Typically, the memory 124-1 (configured to have a longer column length than the row length) is slower, and the added delays exacerbate the issue by rendering the memory 124-1 even slower.

Figure 7:
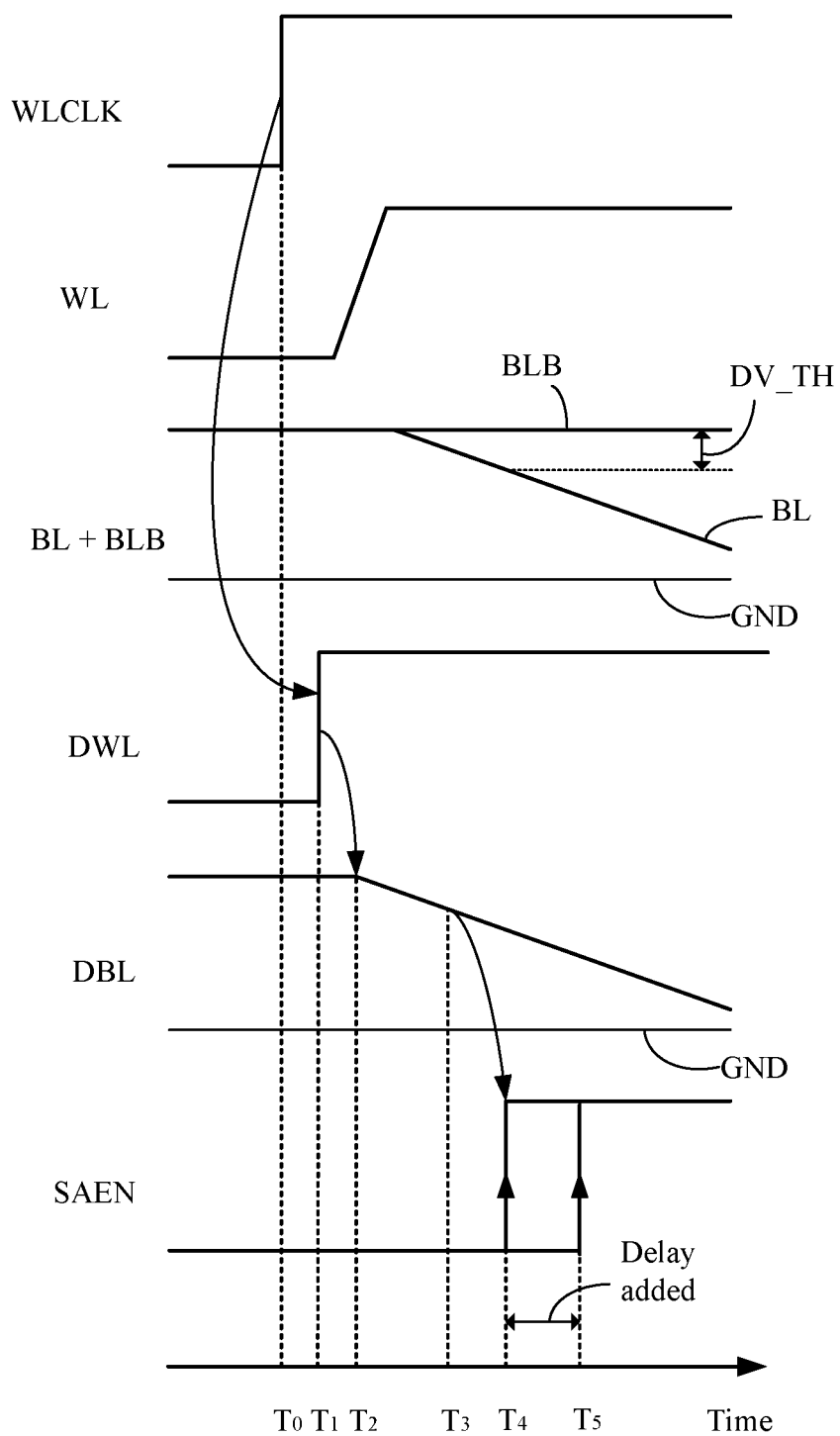
FIG. 7 is a diagram of waveforms of the timing circuit asserting the SAEN signal to enable the sense amplifiers of FIG. 3.

FIG. 7 is a diagram of waveforms of the timing circuit asserting the SAEN signal to enable the sense amplifiers of FIG. 3. At $T_0$, the WLCLK signal is asserted (e.g., pull to a high level) to signal the start of a memory access. In response, the wordline WL is asserted and the bitline BL or BLB is pulled down, as described with respect to FIG. 4. At $T_1$, the dummy wordline is asserted. For example, in the timing circuit 310, the buffer 508 pulls up the dummy wordline DWL 532 at the node 514. At $T_2$, the dummy bitline DBL is pulled down to emulate the pull-down of the bitline BL or BLB. For example, in the timing circuit 310, the buffer 508 pulls up the dummy wordline DWL 532 at the node 514.

At $T_3$, the dummy bitline DBL 530 is pulled down to a level to trigger the second logic block 512. For example, the trigger level at the dummy bitline DBL 530 may correspond to an optimal voltage differential at the bitline pair BL and BLB. The optimal voltage differential may be one that does not cause a false read at the SAs 320 and is not unduly large to cause a delay in read time. The $T_4$, the second logic block 512, in response to the dummy bitline DBL 530 being pulled to the trigger level, asserts the SAEN signal to enable the SAs 320. In some examples, $T_4$ corresponds to an optimal timing to assert the SAEN signal. Thus, asserting the SAEN signal to turn on the SAs 320 at $T_4$ allows the SAs 320 to read out the correct read data without undue delays. However, when the timing circuit 310 is used in both the memories 124-1 and 124-2, delays may be added for the memory 124-2 (as presented above, for example, to account for the dominate wordline delay). As a result, the timing circuit 310 in the memory 124-1 may assert the SAEN signal at $T_5$.

Presented herein are exemplary embodiments of the timing circuit to balance the read access times over the different configurations of memories (e.g., the memories 124-1 and 124-2). One aspect of the exemplary embodiments presented infra allows for a reduction of added delay for the memory 124-1 (e.g., in a case the column length is greater than the row length) to reduce the read access time. For example, the embodiments reduce the delay between $T_4$ and $T_5$ of FIG. 7, thereby improving the read access time for the memory 124-1.

Figure 8:
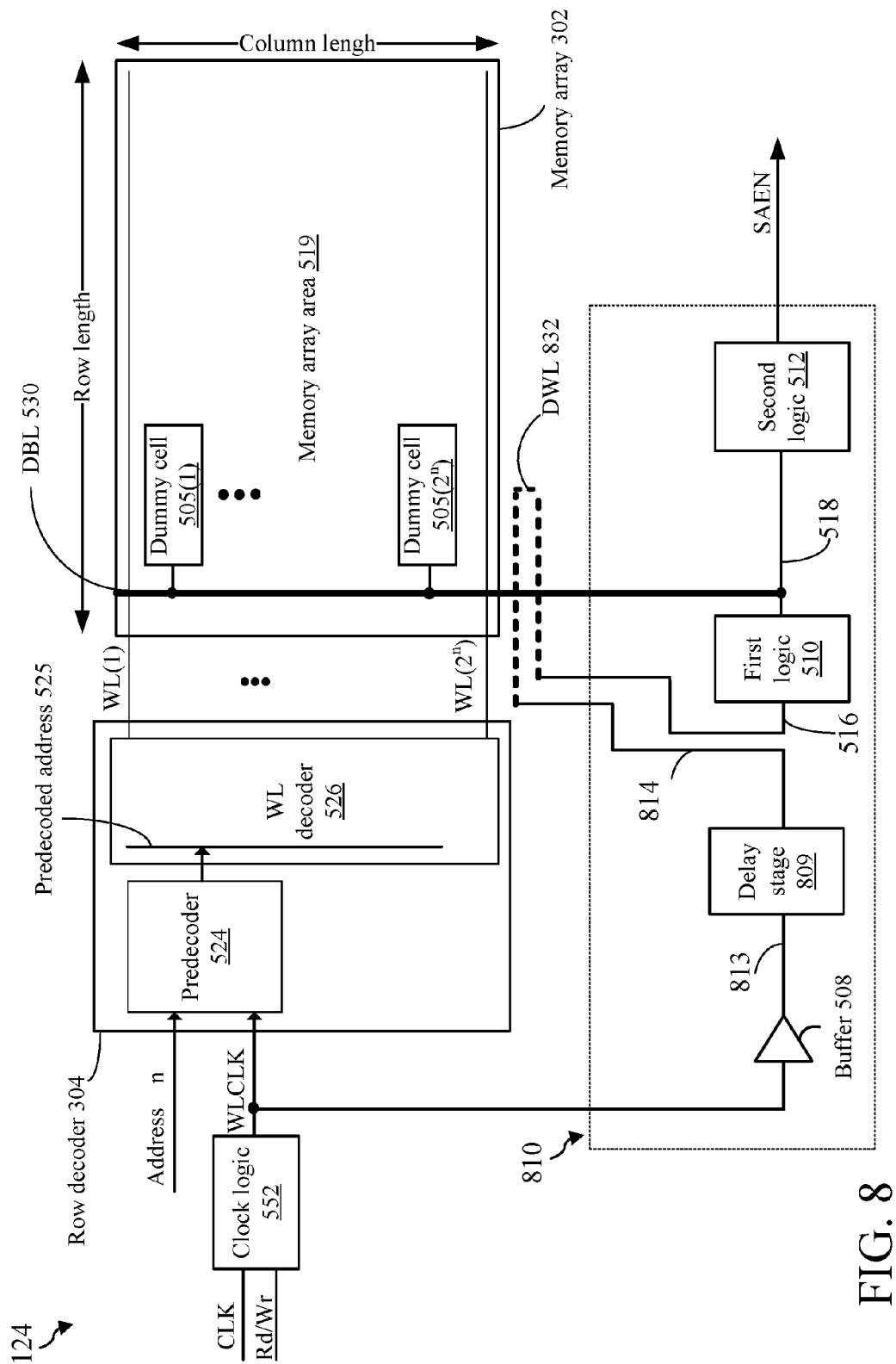
FIG. 8 is a diagram of an exemplary embodiment of a timing circuit operating to enable sense amplifiers.

FIG. 8 is a diagram of an exemplary embodiment of a timing circuit operating to enable sense amplifiers. The memory 124 includes multiple memory cells 200 arranged as a memory array 302 in the memory array area 519. A wordline WL couples to multiple memory cells 200 (e.g., C1 or C2 columns of memory cells 200 are coupled to a wordline WL). Each of the column of memory cells 200 may be coupled to a SA 320 via the bitline pair BL and BLB, as presented with respect to FIG. 3. The bitline pair BL and BLB is routed through (e.g., disposed in) the memory array area 519.

The memory 124 incorporates the timing circuit 810 configured to operate memories of different configurations (e.g., the memory 124-1 and the memory 124-2). The timing circuit 810 includes a delay chain incorporating a delay stage 809, a dummy wordline DWL 832, and the dummy bitline DBL 530 arranged in series. In one example, the dummy bitline DBL 530 (and the dummy cells 505) may be routed in the memory array area 519 and coupled to the same number of dummy cells 505 as the memory 124 and the timing circuit 310 of FIG. 5.

In the timing circuit 810, the buffer 508 receives the WLCLK signal and outputs signaling to the delay stage 809, via the node 813. The delay stage 809 receive the signaling via the node 813, and outputs to the dummy wordline DWL 832 via the node 814. The dummy wordline DWL 832 is coupled to the first logic block 510 via the node 516. The first logic block 510, in response to a changing of states of the dummy wordline DWL 832, outputs to the node 518, which is coupled to the dummy bitline DBL 530. The second logic block 512, in response to an operation of the dummy bitline DBL 530 (e.g., pulling down the dummy bitline DBL 530), outputs the SAEN signal to enable the SAs 320.

In one implementation, the buffer 508 receives the WLCLK signal and may, in response to an assertion of the WLCLK signal, assert the dummy wordline DWL 832 via the delay stage 809, the dummy wordline DWL 832 and the delay stage 809 being arranged in series. The dummy wordline DWL 832 may be configured to emulate a delay of at least one portion of the wordline WL (e.g., less than a whole of the wordline WL). For example, the portion of the wordline WL may be half or approximately half of the wordline WL. The dummy wordline DWL 832 may be folded and include two legs each of ¼ of the length of the wordline WL.

Figure 9:
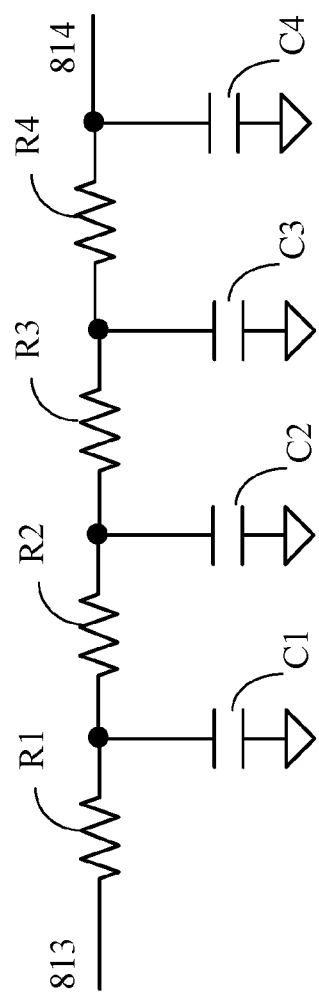
FIG. 9 is a diagram of an exemplary embodiment of a delay stage in the timing circuit.

In one aspect, the delay stage 809 may include a resistance-capacitance (RC) delay circuit. FIG. 9 is a diagram of an exemplary embodiment of a delay stage in the timing circuit. The delay stage 809 may include a distributed RC circuit having four equal RC stages. The first stage includes the resistor R1 and the capacitor C1. The second stage includes the resistor R2 and the capacitor C2, and so forth. The number of RC stages is not particularly limiting. The total resistance of the delay stage 809 is the sum of the resistances of all the RC stages (e.g., the resistors R1-R4). The total capacitance of the delay stage 809 is the sum of the capacitance of all the RC stages (e.g. the capacitors C1-C4).

In one aspect, the delay stage 809 emulates a portion of the wordline WL and loading of a number of memory cells 200 coupled to the portion of the wordline WL. For example, the delay stage 809 may include loading corresponding to at least one of the memory cells 200. the total capacitance of the delay stage 809 may approximate loading of a fixed number of the memory cells 200 coupled to the wordline WL (e.g., loading of the gates of the access transistors 214 and 218). The fixed number may be, for example, 64 for both the memory 124-1 and 124-2. The delay stage 809 may further includes loading corresponding to a second portion of the wordline WL. For example, delay stage 809 may further include the resistance and capacitance of the length of the wordline WL coupling to the fixed number of the memory cells 200. For example, the total resistance of the delay stage 809 may correspond to the resistance of a length of the wordline WL coupled to the 64 memory cells 200. The total capacitance of the delay stage 809, in addition to the loading of the fixed number of the memory cells 200, may further include the capacitance of the length of the wordline WL coupled to the 64 memory cells 200.

The timing circuit 810 may provide different tracking of the wordline WL for memories of different configurations. For example, the length and loading of the wordline WL in the memory 124-1 is greater than the length and loading of the wordline WL in the memory 124-2. Thus, the loading of the 64 memory cells 200 of the delay stage 809 may account for a larger portion of the wordline WL loading in the memory 124-2 than the loading of the memory 124-1. Accordingly, less delays are needed for the memory 124-2, and the difference between $T_4$ and $T_5$ of FIG. 7 is reduced.

Referring back to FIG. 8, in another aspect, the dummy wordline DWL 832 may be configured to emulate a delay of at least one portion of the wordline WL (e.g., less than a whole of the wordline WL). For example, the portion of the wordline WL may be or approximately a whole (e.g., a whole length) of the wordline WL. The dummy wordline DWL 832 may be folded and include two legs each of ½ of the length of the wordline WL.

The delay stage 809 may be configured to correspond to a delay of a portion of the wordline decoder (e.g., the row decoder 304), the wordline decoder being configured to drive the wordline WL. For example, the wordline decoder may include an address decoder, such as the predecoder 524. The delay stage 809 may be configured to correspond to a delay of address decoder (e.g., the predecoder 524). That is, the portion of the wordline decoder may be the address decoder, such as the predecoder 524. In one implementation, the total resistance and capacitance of the delay stage 809 may be configured to approximate a delay of the predecoder 524 (and may include a delay of the predecoded address 525).

In another implementation, referring to FIGS. 1 and 8, a first memory 124-1 includes a first wordline (e.g., one of the wordlines WL of FIG. 8) coupled to a first number (e.g., C1) of the memory cells 200. A second memory 124-2 includes a second wordline (e.g., one of the wordlines WL of FIG. 8) coupled to a second number (e.g., C2) of the memory cells 200. Each of the first memory 124-1 and the second memory 124-2 includes a timing circuit 810 to enable a memory operation, such as activation of the SAs 320 to output read data. The timing circuit 810 includes a delay stage 809 corresponding to loading of a third number of memory cells 200. The third number may be 64, different from C1 and/or C2. In some examples, the numbers of memory cells 200 coupled to wordlines WL in the memories 124-1 and 124-2 may range from 8 to 256, and the loading in the delay stage 809 corresponds to a fixed number of memory cells 200 independent of the numbers of memory cells 200 coupled to wordlines WL in the memories 124-1 and 124-2. In some examples, the delay stage 809 may include an RC delay circuit (see, e.g., FIG. 9) to perform the delay function.

The timing circuit 810 may further include a dummy wordline DWL 832 configured to emulate a delay of at least one portion of the wordline WL in the first memory 124-1 and the second memory 124-2. In some examples, the dummy wordline DWL 832 is configured to emulate a delay of half or approximately half of the wordline WL.

In the embodiment presented above, the timing circuit 810 may track more closely the assertion of the wordline WL. Accordingly, less delays are needed for both the memories 124-1 and 124-2, and the difference between $T_4$ and $T_5$ of FIG. 7 may thus be reduced.

Figure 10:
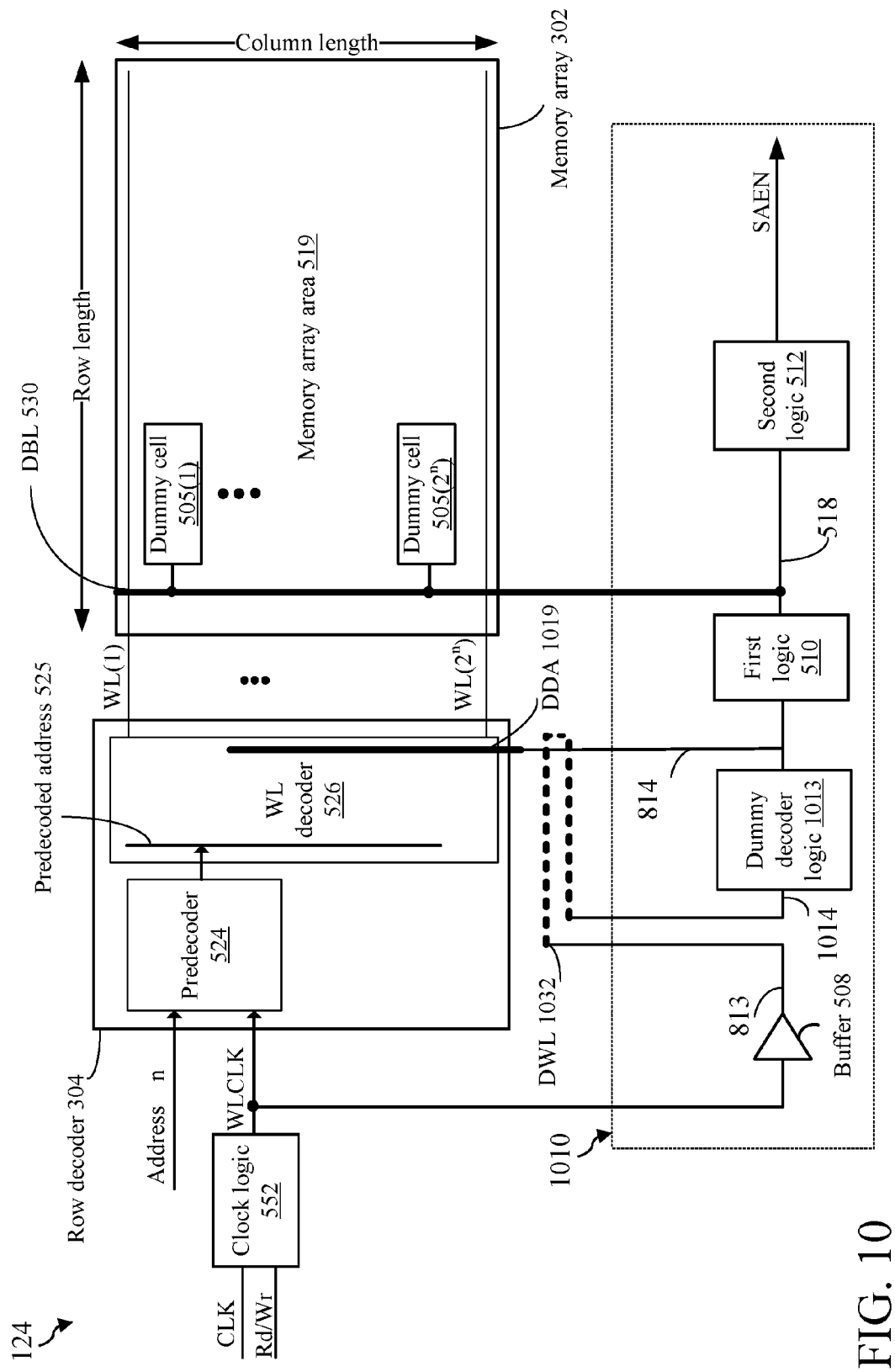
FIG. 10 is a diagram of an exemplary embodiment of a timing circuit operating to enable sense amplifiers.

FIG. 10 is a diagram of an exemplary embodiment of a timing circuit operating to enable sense amplifiers. The memory 124 incorporates the timing circuit 1010 configured to operate memories of different configurations (e.g., the memories 124-1 and 124-2). The timing circuit 1010 may be configured as a delay chain incorporating a dummy wordline DWL 1032, a dummy decoded address DDA 1019, and the dummy bitline DBL 530 arranged in series. In one example, the dummy bitline DBL 530 may be routed in the memory core area and coupled to the same number of dummy cells as the memory 124 and the timing circuit 310 of FIG. 5.

In the timing circuit 1010, the buffer 508 receives the WLCLK signal and outputs signaling to the dummy wordline DWL 1032, via the node 813. The dummy wordline DWL 1032 is coupled to the dummy decoder logic 1013 via the node 1014. The dummy decoder logic 1013 asserts (e.g., drives high) the dummy decoded address DDA 1019, via the node 814. The first logic block 510, in response to a changing of states of the dummy decoded address DDA 1019, outputs to the node 518, which is coupled to the dummy bitline DBL 530. The second logic block 512, in response to an operation of the dummy bitline DBL 530 (e.g., pulling down the dummy bitline DBL 530), outputs the SAEN signal to enable the SAs 320.

In one implementation, the dummy wordline DWL 1032 may be configured to emulate a delay of at least one portion of the wordline WL (e.g., less than a whole of the wordline WL). For example, the portion of the wordline WL may be or approximately a whole of the wordline WL. The dummy wordline DWL 1032 may be folded and include two legs each of ½ of the length of the wordline WL.

The dummy decoded address DDA 1019 may be referred to as a delay stage, as the dummy decoded address DDA 1019 provides a delay function. The wordline decoder (e.g., the row decoder 304) includes at least one decoded address (e.g., the predecoded address 525. The dummy decoded address DDA 1019 may be configured to emulate the predecoded address 525. As presented above, the predecoded address 525 may extend a distance approximately ¾ of the WL decoder 526. The dummy decoded address DDA 1019 may likewise include a conductive line (e.g., a metal layer) routed for ¾ of the WL decoder 526 to emulate the predecoded address 525.

In the embodiment presented above, the timing circuit 1010 may track more closely the assertion of the wordline WL by tracking the predecoded address 525. For example, referring to FIG. 1, the memory 124-1 may have a column length greater than the column length of the memory 124-2 (e.g., due to the number of rows per column, R1, of the memory 124-1 being greater than the number of rows per column, R2, of the memory 124-2). Because the assertion of the wordline WL is tracked more closely in both the memories 124-1 and 124-2, less added delays are needed for both the memories 124-1 and 124-2. The difference between $T_4$ and $T_5$ of FIG. 7 may thus be reduced.

Figure 11:
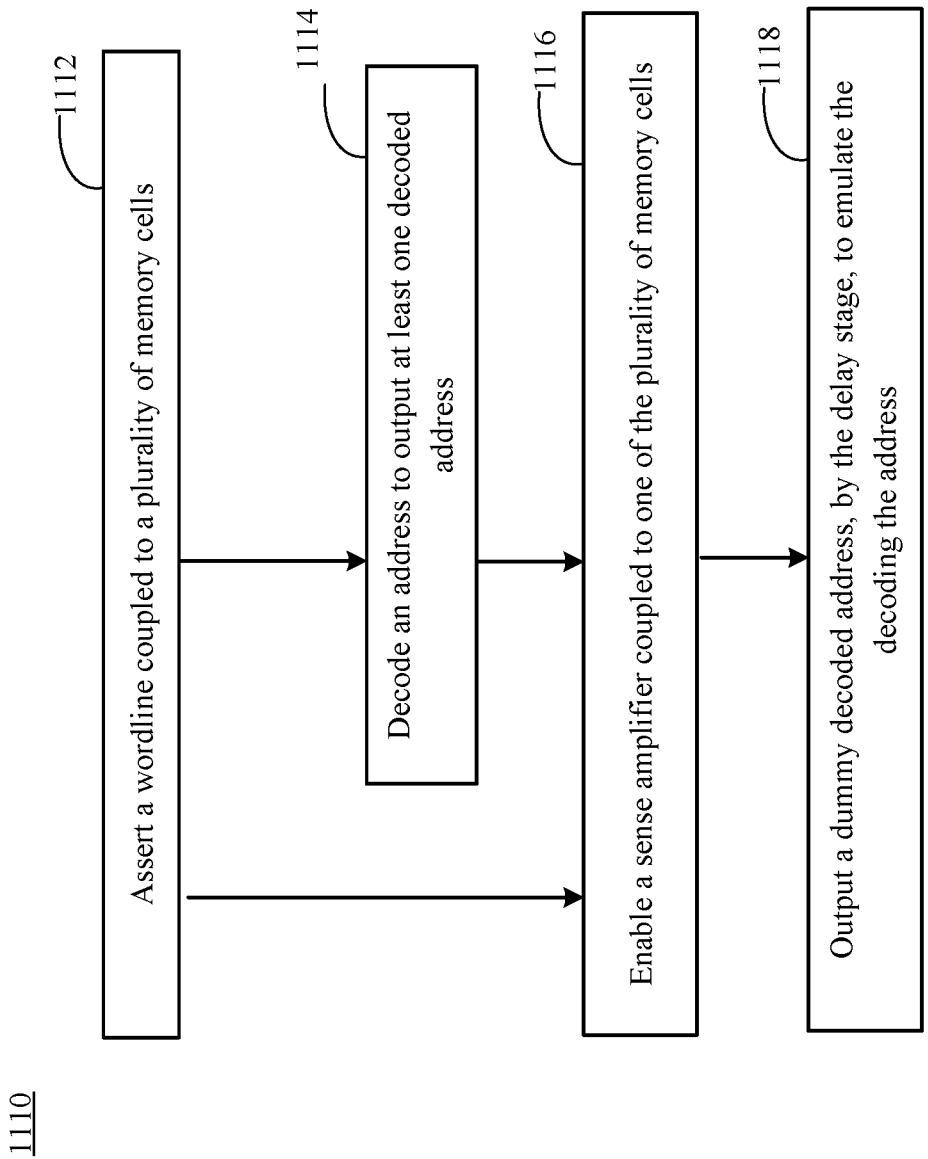
FIG. 11 is a flowchart of a method to operate the memory of FIG. 8.

FIG. 11 is a flowchart 1100 of a method to operate the memory of FIG. 8. The method may be performed by, for example, circuits of FIGS. 8 and 9. At 1112, a wordline coupled to a plurality of memory cells is asserted. For example, the wordline decoder (e.g., the row decoder 304) decodes the address and asserts the wordline WL. At 1114, an address is decoded to output at least one decoded address. For example, the row decoder 304 includes the predecoder 524. The predecoder 524 decodes the row address and outputs the predecoded address 525.

At 1116, a sense amplifier coupled to one of the plurality of memory cells is enabled. For example, the timing circuit 810 is configured to enable the SAEN signal to activate the SAs 320. The timing circuit 810 flows the signal through the delay stage 809 and through the dummy wordline DWL 532. Referring to FIG. 8, the delay stage 809 may be configured to correspond to a delay of a portion of the asserting the wordline WL. At 1118, a dummy decoded address is outputted by the delay stage to emulate the decoding the address. For example, the portion of the asserting the wordline WL may be the predecoder 524 decoding for the predecoded address 525. Referring to FIG. 10, the delay stage 809 may output a dummy decoded address DDA 1019 configured to emulate the decoding of the predecoded address 525.

Referring to 1116, the dummy wordline DWL 532 may be configured to emulate, for example, half of the wordline WL in one case and a whole of the wordline WL in a second case. The delay stage 809 and the dummy wordline DWL 532 may be arranged in series. The timing circuit 810 may father enable the SAs 320 based on operating the dummy bitline DBL 530. The dummy bitline DBL 530 may be configured to emulate the bitline BL or BLB coupled to the SAs 320.

Figure 12:
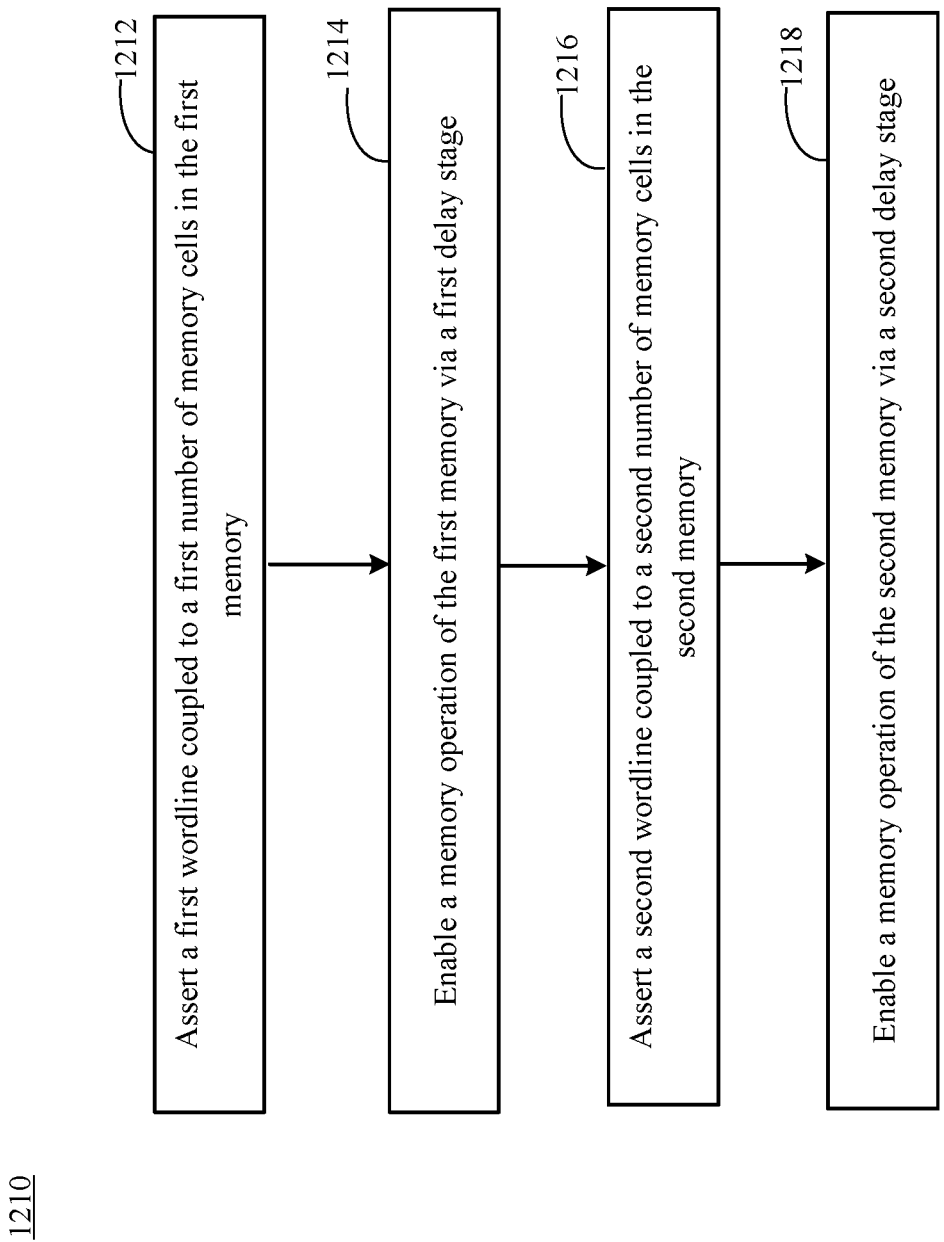
FIG. 12 is a flowchart of a method to operate the memories of FIGS. 1 and 8.

FIG. 12 is a flowchart of a method to operate the memories of FIGS. 1 and 8. The method 1210 may be performed by the memory 124-1 and the memory 124-2 of FIG. 1, incorporating the timing circuit 810. At 1212, a first wordline coupled to a first number of memory cells is asserted in the first memory. For example, the memory 124-1 includes wordlines WL, each of the wordlines WL is coupled to C1 memory cells 200. Referring to FIG. 8, the memory 124-1 may include the row decoder 304 configured to assert the selected wordline WL. At 1214, a memory operation of the first memory is enabled via a first delay stage. For example, the timing circuit 810 of the memory 124-1 includes the delay stage 809 and enables the SAs 320 via the delay stage 809.

At 1216, a second wordline coupled to a second number of memory cells is asserted in the second memory. For example, the memory 124-2 (e.g., the second memory) includes wordlines WL, each of the wordlines WL is coupled to C2 memory cells 200. Referring to FIG. 8, the memory 124-2 may include the row decoder 304 configured to assert the selected wordline WL. At 1218, a memory operation of the second memory is enabled via a second delay stage. For example, the timing circuit 810 of the memory 124-2 includes the delay stage 809 (e.g., the second delay stage) and enables the SAs 320 via the delay stage 809.

In some examples, the delay stages 809 of the memory 124-1 and the memory 124-2 may be configured to correspond to loading of a third or fixed number of memory cells 200. For example, the third or fixed number may be 64. The numbers C1 and C2 may range from 8 to 256, and the third or fixed number may differ from the number C1 and/or the number C2. In some examples, the delay stages 809 of the memory 124-1 and the memory 124-2 may include RC delay circuits illustrated in FIG. 9.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f), unless the element is expressly recited using the phrase "means for" or, in the case of a method claim, the element is recited using the phrase "step for."

What is claimed is:

1. A memory, comprising:
   a plurality of memory cells;
   a wordline coupled to the plurality of memory cells;
   a sense amplifier coupled to one of the plurality of memory cells; and
   a timing circuit coupled to a wordline clock independent of a wordline decoder, the timing circuit configured to enable the sense amplifier, wherein the timing circuit comprises a delay stage and a dummy wordline arranged in series, the dummy wordline being configured to emulate at least one portion of the wordline,
   wherein the delay stage has a loading corresponding to at least one of the plurality of memory cells, the loading corresponding to at least loading of a second portion of the wordline.

2. The memory of claim 1, further comprising:
   a bitline configured to couple the sense amplifier and the one of the plurality of memory cells, wherein the plurality of memory cells and the bitline are disposed in a memory array area; and
   a dummy bitline routed in the memory array area to emulate the bitline, wherein the timing circuit is further configured to enable the sense amplifier based on an operation of the dummy bitline.

3. The memory of claim 1, wherein the at least one portion of the wordline is less than a whole of the wordline.

4. The memory of claim 1, wherein the at least one portion of the wordline is approximately half of a length of the wordline.

5. A memory, comprising:
   a plurality of memory cells;
   a wordline coupled to the plurality of memory cells;
   a sense amplifier coupled to one of the plurality of memory cells; and
   a timing circuit coupled to a wordline clock independent of a wordline decoder, the timing circuit configured to enable the sense amplifier, wherein the timing circuit comprises a delay stage and a dummy wordline arranged in series, the dummy wordline being configured to emulate at least one portion of the wordline, wherein the wordline decoder is further configured to drive the wordline, wherein the delay stage is configured to correspond to a delay of a portion of the wordline decoder.

6. The memory of claim 5, wherein the portion of the wordline decoder comprises an address decoder.

7. The memory of claim 6, wherein the at least one portion of the wordline is approximately a whole of the wordline.

8. A memory, comprising:
   a plurality of memory cells;
   a wordline coupled to the plurality of memory cells;
   a sense amplifier coupled to one of the plurality of memory cells; and
   a timing circuit coupled to a wordline clock independent of a wordline decoder, the timing circuit configured to enable the sense amplifier, wherein the timing circuit comprises a delay stage and a dummy wordline arranged in series, the dummy wordline being configured to emulate at least one portion of the wordline, wherein the wordline decoder is further configured to drive the wordline, wherein the wordline decoder is configured to output at least one decoded address, and the delay stage is configured to emulate the wordline decoder by outputting a dummy decoded address.

9. A method to operate a memory, comprising:
   asserting a wordline coupled to a plurality of memory cells;
   enabling a sense amplifier coupled to one of the plurality of memory cells, wherein the enabling the sense amplifier is based on flowing a signal from a wordline clock independent of a wordline decoder through a delay stage and a dummy wordline arranged in series, the dummy wordline being configured to emulate at least one portion of the wordline,
   wherein the delay stage used has a loading corresponding to at least one of the plurality of memory cells, the loading corresponding to at least loading of a second portion of the wordline.

10. The method of claim 9, wherein the enabling the sense amplifier is further based on operating a dummy bitline,
    wherein the dummy bitline is configured to emulate a bitline coupling the sense amplifier and the one of the plurality of memory cells, and
    wherein the plurality of memory cells, the bitline, and the dummy bitline are disposed in a memory array area.

11. The method of claim 9, wherein the at least one portion of the wordline is less than a whole of the wordline.

12. The method of claim 9, wherein the at least one portion of the wordline is approximately half of a length of the wordline.

13. A method to operate a memory, comprising:
    asserting a wordline coupled to a plurality of memory cells;
    enabling a sense amplifier coupled to one of the plurality of memory cells, wherein the enabling the sense amplifier is based on flowing a signal from a wordline clock independent of a wordline decoder through a delay stage and a dummy wordline arranged in series, the dummy wordline being configured to emulate at least one portion of the wordline, wherein the delay stage is configured to correspond to a delay of a portion of the asserting the wordline.

14. The method of claim 13, wherein the asserting the wordline comprises decoding an address, and the portion of the asserting the wordline comprises the decoding the address.

15. The method of claim 14, wherein the at least one portion of the wordline is approximately a whole of the wordline.

16. A method to operate a memory, comprising:
asserting a wordline coupled to a plurality of memory cells;
enabling a sense amplifier coupled to one of the plurality of memory cells, wherein the enabling the sense amplifier is based on flowing a signal from a wordline clock independent of a wordline decoder through a delay stage and a dummy wordline arranged in series, the dummy wordline being configured to emulate at least one portion of the wordline, wherein the asserting the wordline comprises decoding an address to output at least one decoded address, and the enabling the sense amplifier coupled to one of the plurality of memory cells comprises outputting a dummy decoded address, by the delay stage, to emulate the decoding the address.

17. An apparatus, comprising:
a first memory comprising
a first number of memory cells, and
a first wordline coupled to the first number of memory cells; and
a second memory comprising
a second number of memory cells, and
a second wordline coupled to the second number of memory cells,
wherein each of the first memory and the second memory comprises a timing circuit coupled to a wordline clock independent of a wordline decoder, each timing circuit configured to enable a memory operation, and
wherein the timing circuit comprises a delay stage configured to correspond to loading of a third number of memory cells, wherein the third number of memory cells is different from the first number of memory cells.

18. The apparatus of claim 17, wherein the third number of memory cells is different from the second number of memory cells.

19. The apparatus of claim 17, wherein the timing circuit comprises a dummy wordline configured to emulate at least one portion of the first wordline in the first memory and to emulate at least one portion of the second wordline in the second memory.

20. The apparatus of claim 19, wherein the at least one portion of the first wordline comprises approximately half of a length of the first wordline.

21. The apparatus of claim 17, wherein the delay stage comprises a resistance-capacitance delay circuit.

22. A method to operate a first memory and a second memory, comprising:
asserting a first wordline coupled to a first number of memory cells in the first memory;
enabling a memory operation of the first memory via a first delay stage;
asserting a second wordline coupled to a second number of memory cells in the second memory; and
enabling a memory operation of the second memory via a second delay stage;
wherein the first delay stage and the second delay stage are coupled to a wordline clock independent of a wordline decoder, and configured to correspond to loading of a third number of memory cells, wherein the third number of memory cells is different from the first number of memory cells.

23. The method of claim 22, wherein the third number of memory cells is different from the second number of memory cells.

24. The method of claim 22, wherein each of the first delay stage and the second delay stage comprises a resistance-capacitance delay circuit.

* * * * *